(12) United States Patent
Bito

(10) Patent No.: US 11,901,038 B2
(45) Date of Patent: Feb. 13, 2024

(54) MEMORY SYSTEM

(71) Applicant: KIOXIA CORPORATION, Tokyo (JP)

(72) Inventor: Akinori Bito, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 72 days.

(21) Appl. No.: 17/679,773

(22) Filed: Feb. 24, 2022

(65) Prior Publication Data

US 2023/0065754 A1   Mar. 2, 2023

(30) Foreign Application Priority Data

Aug. 31, 2021   (JP) ................. 2021-141392

(51) Int. Cl.
| | |
|---|---|
| *G11C 8/00* | (2006.01) |
| *G11C 7/10* | (2006.01) |
| *G06F 13/16* | (2006.01) |
| *G06F 13/40* | (2006.01) |
| *H03K 19/17736* | (2020.01) |

(52) U.S. Cl.
CPC ........ *G11C 7/1066* (2013.01); *G06F 13/1668* (2013.01); *G06F 13/4068* (2013.01); *G11C 7/1093* (2013.01); *H03K 19/17744* (2013.01)

(58) Field of Classification Search
CPC ..... G11C 7/1066; G11C 7/1093; G11C 7/222; G06F 13/1668; G06F 13/4068; H03K 19/17744
USPC ...................................................... 365/233.1
See application file for complete search history.

(56) References Cited

U.S. PATENT DOCUMENTS

| | | | | |
|---|---|---|---|---|
| 8,578,222 | B2 * | 11/2013 | Chun ................. | H04L 1/0001 |
| | | | | 714/704 |
| 10,880,137 | B2 | 12/2020 | Das Sharma | |
| 10,958,413 | B2 | 3/2021 | Li et al. | |
| 11,477,004 | B1 * | 10/2022 | Aziz .................. | H04L 7/0054 |
| 2018/0241540 | A1 * | 8/2018 | Shibasaki ........... | H04L 7/0334 |
| 2020/0274539 | A1 | 8/2020 | Katsuragi | |
| 2021/0080994 | A1 | 3/2021 | Takada | |

FOREIGN PATENT DOCUMENTS

| | | |
|---|---|---|
| JP | 2011-248814 A | 12/2011 |
| JP | 2020-141203 A | 9/2020 |
| JP | 2021-048491 A | 3/2021 |

* cited by examiner

*Primary Examiner* — Tha-O H Bui

(74) *Attorney, Agent, or Firm* — Kim & Stewart LLP

(57) ABSTRACT

A memory system includes a nonvolatile memory, and a controller including an equalizer circuit and a clock-and-data output circuit. The equalizer circuit receives a first data signal from a host via a serial communication, reduces an inter-symbol interference jitter of the first data signal to generate a second data signal, and outputs the second data signal. The clock-and-data output circuit extracts a third data signal and a clock signal from the second data signal and outputs the third data signal and the clock signal. The controller executes, when a link speed with the host is switched, a process of detecting predetermined data in the third data signal based on the first data signal received from the host, and resets a state of the clock-and-data output circuit when the predetermined data is not detected within a predetermined period of time.

20 Claims, 10 Drawing Sheets

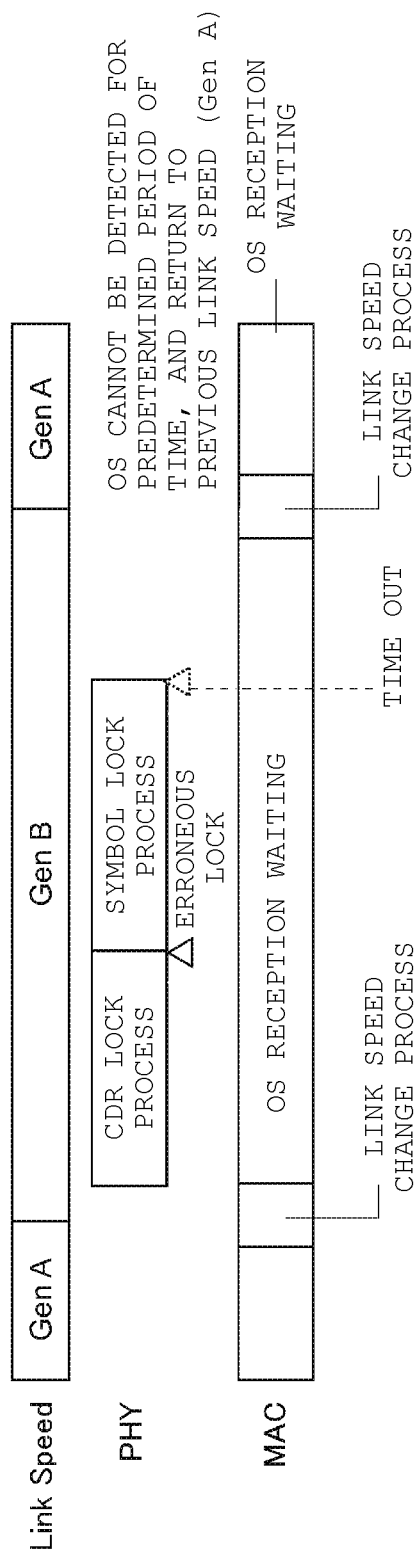

US 11,901,038 B2

MEMORY SYSTEM

CROSS-REFERENCE TO RELATED APPLICATION

This application is based upon and claims the benefit of priority from Japanese Patent Application No. 2021-141392, filed Aug. 31, 2021, the entire contents of which are incorporated herein by reference.

FIELD

Embodiments described herein relate generally to a memory system.

BACKGROUND

An increase in the link speed of the memory system is desired.

DESCRIPTION OF THE DRAWINGS

FIG. 10 is a schematic timing chart illustrating an operation of a memory system according to a comparative example.

DETAILED DESCRIPTION

Figure 1:
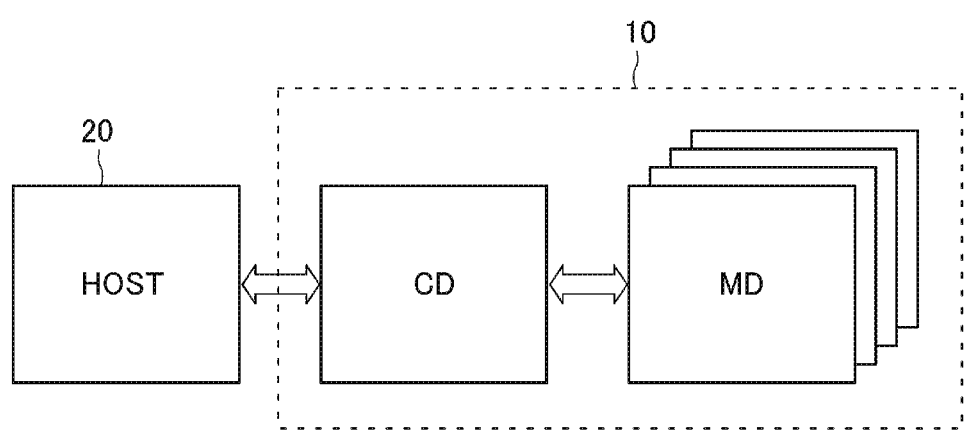
FIG. 1 is a schematic block diagram illustrating a configuration of a memory system according to an embodiment.

Embodiments implement an increase in the speed of a memory system.

In general, according to one embodiment, a memory system includes a nonvolatile memory, and a controller electrically connected to the nonvolatile memory and including at least an equalizer circuit and a clock-and-data output circuit. The equalizer circuit receives a first data signal from a host via a serial communication, reduces an inter-symbol interference jitter of the first data signal to generate a second data signal, and outputs the second data signal. The clock-and-data output circuit extracts a third data signal and a clock signal from the second data signal and outputs the third data signal and the clock signal. The controller executes, when a link speed with the host is switched from a first link speed to a second link speed, a detection process of detecting predetermined data in the third data signal based on the first data signal received from the host at the second link speed, and resets a state of the clock-and-data output circuit when the predetermined data is not detected within a predetermined period of time in the detection process.

A memory system according to an embodiment will be described in detail with reference to the drawings. The following embodiment is merely an example and is not intended to limit the scope of the present disclosure. In addition, the following drawings are schematic, and an illustration of a part of the configuration or the like may be omitted for convenience of description. In addition, components common to a plurality of embodiments will be represented by the same reference numerals, and the description thereof will not be repeated.

In the present specification, a first element "being electrically connected to" a second element includes a state where the first element is connected to the second element and a state where the first element is directly connected to the second element via a wiring, a semiconductor member, a transistor, or the like. For example, when three transistors are connected in series, even if the second transistor is in an OFF state, the first transistor is "electrically connected" to the third transistor.

In the present specification, a first element being "connected between" a second element and a third element includes a state where the first element, the second element, and the third element are connected in series and the second element is connected to the third element via the first element.

Embodiment

[Configuration]

FIG. 1 is a schematic block diagram illustrating a configuration of a memory system 10 according to an embodiment. The memory system 10 executes a read operation, a write operation, an erase operation, or the like of user data in accordance with a command transmitted from a host 20. The memory system 10 is a system that can store user data. The memory system 10 is, for example, a solid state drive (SSD). The memory system 10 and the host 20 communicate with each other, for example, via a serial communication. The memory system 10 and the host 20 may communicate with each other based on PCI Express (PCIe®).

The memory system 10 includes a plurality of memory dies MD and a controller die CD. The memory die MD stores user data. The memory die MD is, for example, a NAND flash memory.

The controller die CD is electrically connected to the plurality of memory dies MD and the host 20. The controller die CD controls the memory dies MD. The controller die CD is configured with a semiconductor integrated circuit such as a system on a chip (SoC). The controller die CD includes a processor and a random access memory (RAM). The controller die CD executes a process such as conversion between a logical address and a physical address, bit error detection and correction, garbage collection (compaction), or wear leveling. A function of each of units of the controller die CD may be implemented by any one of dedicated hardware, a processor that executes a program, or a combination thereof.

Figure 2:
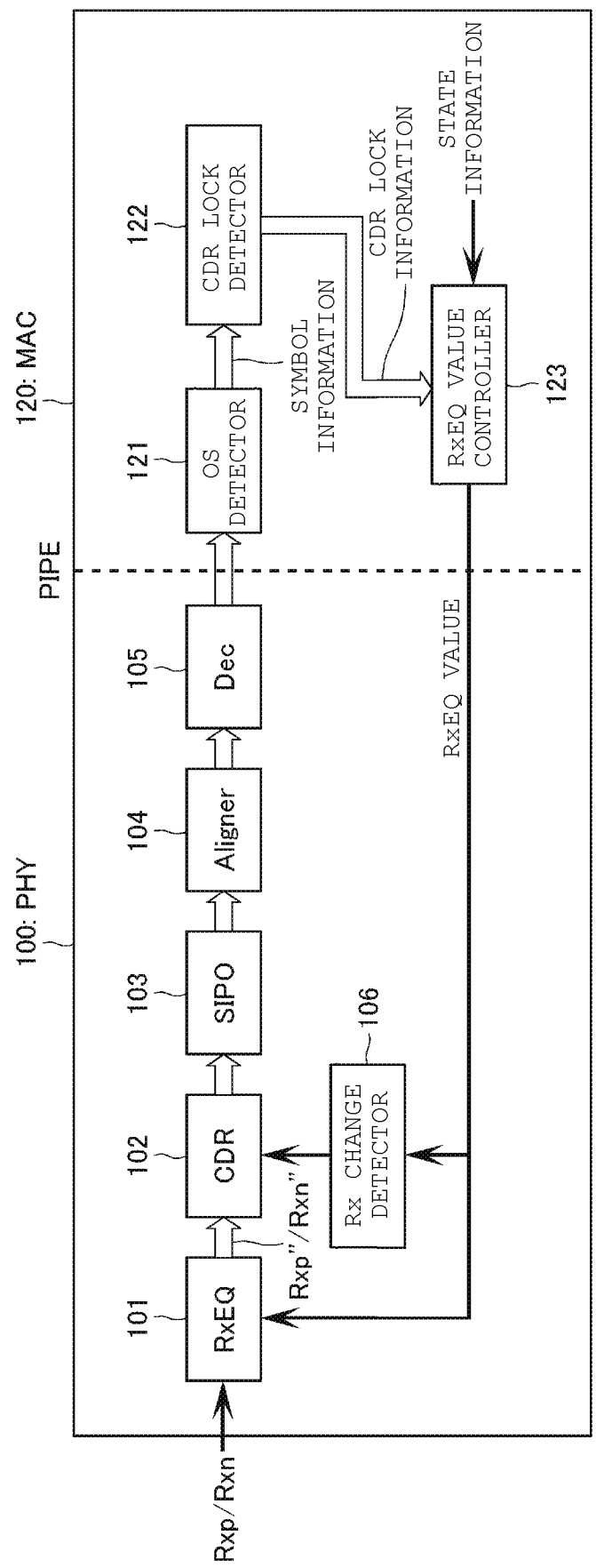
FIG. 2 is a schematic block diagram illustrating a configuration of a part of a controller die according to the embodiment.

FIG. 2 is a schematic block diagram illustrating a configuration of a part of the controller die CD. The controller die CD includes a physical layer control circuit (PHY) 100 and a medium access control (MAC) circuit 120. The physical layer control circuit 100 is connected to the medium access control circuit 120 via a PHY interface for the PCI express architecture (PIPE).

The physical layer control circuit 100 includes a plurality of reception terminals Rxp/Rxn, an equalizer circuit (RxEQ) 101, a clock data recovery (CDR) circuit 102, a serial-input parallel-output (SIPO) circuit 103, an aligner circuit 104, a decoding (Dec) circuit 105, and an Rx change detector 106.

A data signal transmitted from the host 20 (FIG. 1) is input to the reception terminals Rxp/Rxn. The reception terminals Rxp/Rxn include a reception terminal Rxp and a reception terminal Rxn. A differential signal is input to Rxp and Rxn.

The equalizer circuit 101 includes a continuous time linear equalizer (CTLE) and a decision feedback equalizer (DFE). CTLE has, for example, a function of a bypass filter. For example, the CTLE reduces an inter-symbol interference (ISI) jitter of a data signal input to the reception terminals Rxp/Rxn and outputs the data signal to the DFE. The DFE includes, for example, a plurality of delay circuits. For example, the DFE reduces an ISI jitter of a data signal output from the CTLE and outputs the data signal to the CDR circuit 102 via communication terminals Rxp"/Rxn".

The CDR circuit 102 extracts digital data and a clock signal from the data signal input from the equalizer circuit 101. In addition, the CDR circuit 102 outputs the extracted digital data to the SIPO circuit 103 as a data signal. In addition, the CDR circuit 102 outputs the extracted clock signal to the SIPO circuit 103.

The SIPO circuit 103 converts the data signal output from the CDR circuit 102 into a 10-bit parallel signal in accordance with the clock signal output from the CDR circuit 102, and outputs the 10-bit parallel signal into the aligner circuit 104.

The aligner circuit 104 includes, for example, a shift register. The aligner circuit 104 detects a start position of a symbol in the 10-bit parallel signal output from the SIPO circuit 103 and extracts the symbol. In addition, the aligner circuit 104 outputs the extracted symbol to the decoding circuit 105 as the 10-bit parallel signal.

The decoding circuit 105 decodes the 10-bit symbol output from the aligner circuit 104 into an 8-bit symbol. In addition, the decoding circuit 105 outputs the decoded symbol to the medium access control circuit 120 as the 8-bit parallel signal via the PIPE.

The Rx change detector 106 receives one or more RxEQ values described below from the medium access control circuit 120, detects a change of the RxEQ values, and supplies a reset signal to the CDR circuit 102.

The medium access control circuit 120 includes an ordered set (OS) detector 121, a CDR lock detector 122, and an RxEQ value controller 123.

The OS detector 121 receives the 8-bit symbols output from the decoding circuit 105, and determines the type of OS per 16 symbols. The OS detector 121 outputs the determined type of OS to the CDR lock detector 122 as symbol information.

When the type of OS represented by the symbol information output from the OS detector 121 matches a predetermined OS, the CDR lock detector 122 determines that the CDR is locked. When the CDR lock detector 122 determines that the CDR is locked, the CDR lock detector 122 outputs CDR lock information to the RxEQ value controller 123. Optionally, to determine whether the CDR is locked, the CDR lock detector 122 may also use whether the aligner circuit 104 is in a state of outputting valid data.

When the CDR lock information is not received from the CDR lock detector 122 within a predetermined period of time, the RxEQ value controller 123 detects a time out. The predetermined period of time is measured by a timer (not illustrated) in the RxEQ value controller 123. When the time out is detected, the RxEQ value controller 123 outputs the RxEQ values to the equalizer circuit 101 and the Rx change detector 106. The RxEQ values include control parameters for the equalizer circuit 101.

State information is input from a link training and status state machine (LTSSM; not illustrated) to the RxEQ value controller 123. When the state of LTSSM represented by the state information is not a predetermined state, the RxEQ value controller 123 may not detect the time out.

Figure 3:
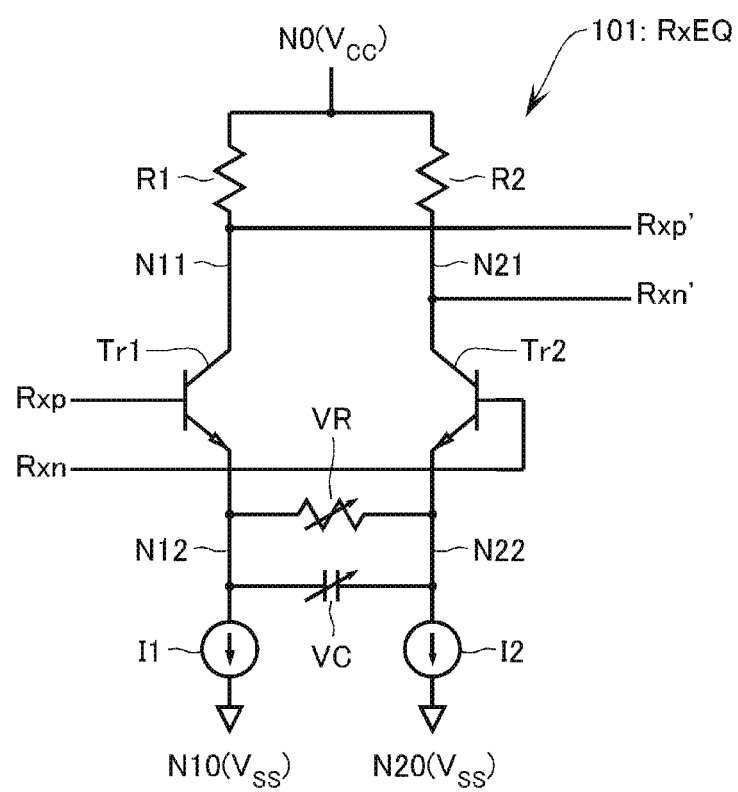
FIG. 3 is a schematic circuit diagram illustrating a configuration example of a part of an equalizer circuit in the controller die according to the embodiment.

FIG. 3 is a schematic circuit diagram illustrating a configuration example of the CTLE of the equalizer circuit 101.

In the configuration example, a voltage $V_{cc}$ is supplied to a power supply node N0. In addition, a ground voltage Vss is supplied to power supply nodes N10 and N20.

In the configuration example, the CTLE includes a resistance R1, a node N11, a bipolar transistor Tr1, a node N12, and a constant current source I1 that are connected in series between the power supply node N0 and the power supply node N10. In addition, the CTLE includes a resistance R2, a node N21, a bipolar transistor Tr2, a node N22, and a constant current source I2 that are connected in series between the power supply node N0 and the power supply node N20. In addition, the CTLE includes a variable resistance VR and a variable capacitor VC that are connected in parallel between the node N12 and the node N22.

In addition, in the configuration example, input terminals of the CTLE are electrically connected to the reception terminals Rxp/Rxn. The reception terminal Rxp is connected to a base terminal of the bipolar transistor Tr1. The reception terminal Rxn is connected to a base terminal of the bipolar transistor Tr2.

In addition, in the configuration example, output terminals of the CTLE are electrically connected to communication terminals Rxp'/Rxn'. The communication terminal Rxp' is connected to the node N11. The communication terminal Rxn' is connected to the node N21.

The RxEQ values described above with reference to FIG. 2 include, for example, at least one of current values and drive voltages of the constant current sources I1 and I2, a resistance value of the variable resistance VR, and a capacitance value of the variable capacitor VC.

Figure 4:
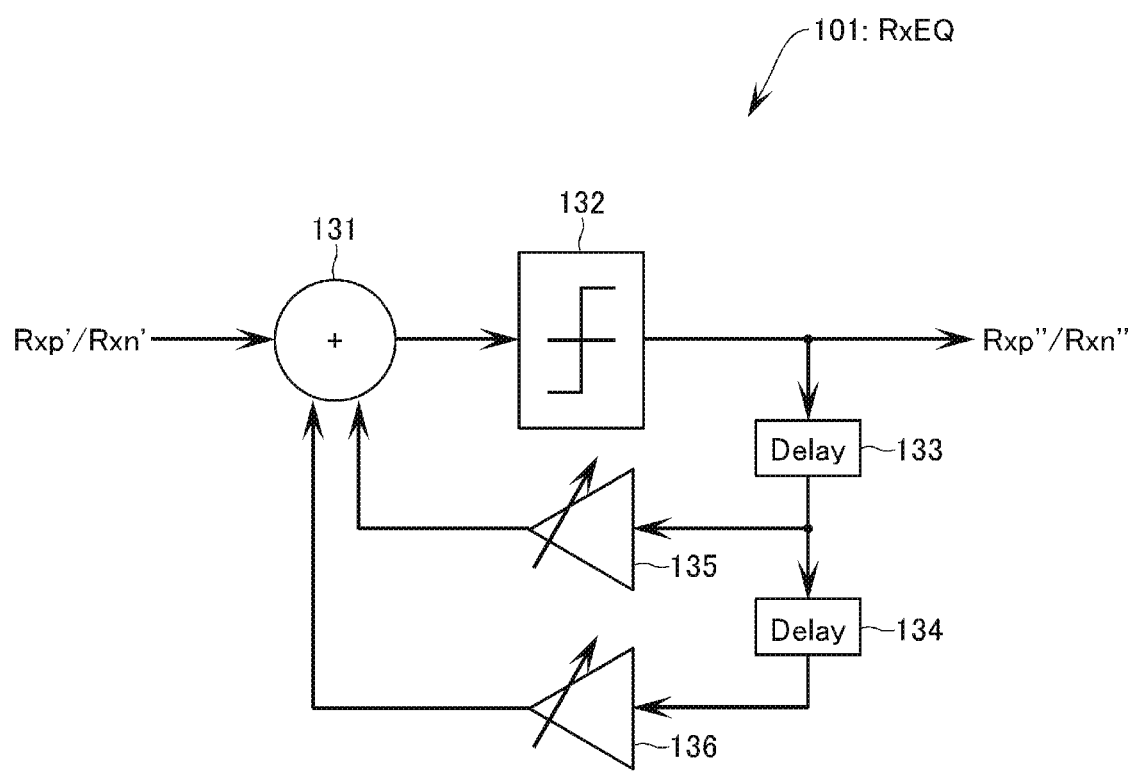
FIG. 4 is a schematic circuit diagram illustrating a configuration example of another part of the equalizer circuit in the controller die according to the embodiment.

FIG. 4 is a schematic circuit diagram illustrating a configuration example of the DFE of the equalizer circuit 101.

In the configuration example, the DFE includes a summer circuit 131 and a determination circuit 132 that are electrically connected between the communication terminals Rxp'/Rxn' and the communication terminals Rxp"/Rxn". In addition, the DFE includes a delay circuit 133, a delay circuit 134, a tap circuit 135, and a tap circuit 136. An output signal of the determination circuit 132 is input to the delay circuit 133. An output signal of the delay circuit 133 is input to the delay circuit 134 and the tap circuit 135. An output signal of the delay circuit 134 is input to the tap circuit 136.

The summer circuit 131 adds the signals input from the communication terminals Rxp'/Rxn' and the output signals of the tap circuits 135 and 136, and outputs the added signal. The determination circuit 132 determines whether the output signal of the summer circuit 131 is "1" or "0", and outputs a signal representing the determination result. The delay circuit 133 delays the output signal of the determination circuit 132, and outputs the delayed signal. The delay circuit 134 delays the output signal of the delay circuit 133, and outputs the delayed signal. The tap circuit 135 multiplies the output signal of the delay circuit 133 by a coefficient, and outputs the multiplied signal. The tap circuit 136 multiplies the output signal of the delay circuit 134 by a coefficient, and outputs the multiplied signal.

Output terminals of the determination circuit 132 are electrically connected to the communication terminals Rxp"/Rxn".

The RxEQ values described above with reference to FIG. 2 include, for example, at least one of the coefficient by which the output signal of the delay circuit 133 is multiplied by the tap circuit 135, and the coefficient by which the output signal of the delay circuit 134 is multiplied by the tap circuit 136.

Note that the configuration illustrated in FIG. 4 is merely an example, and the specific configuration may be appropriately adjusted. For example, the DFE illustrated in FIG. 4 includes the two delay circuits 133 and 134 and the two tap circuits 135 and 136. However, the numbers of the delay circuits and the tap circuits may be one or may be three or more.

Figure 5:
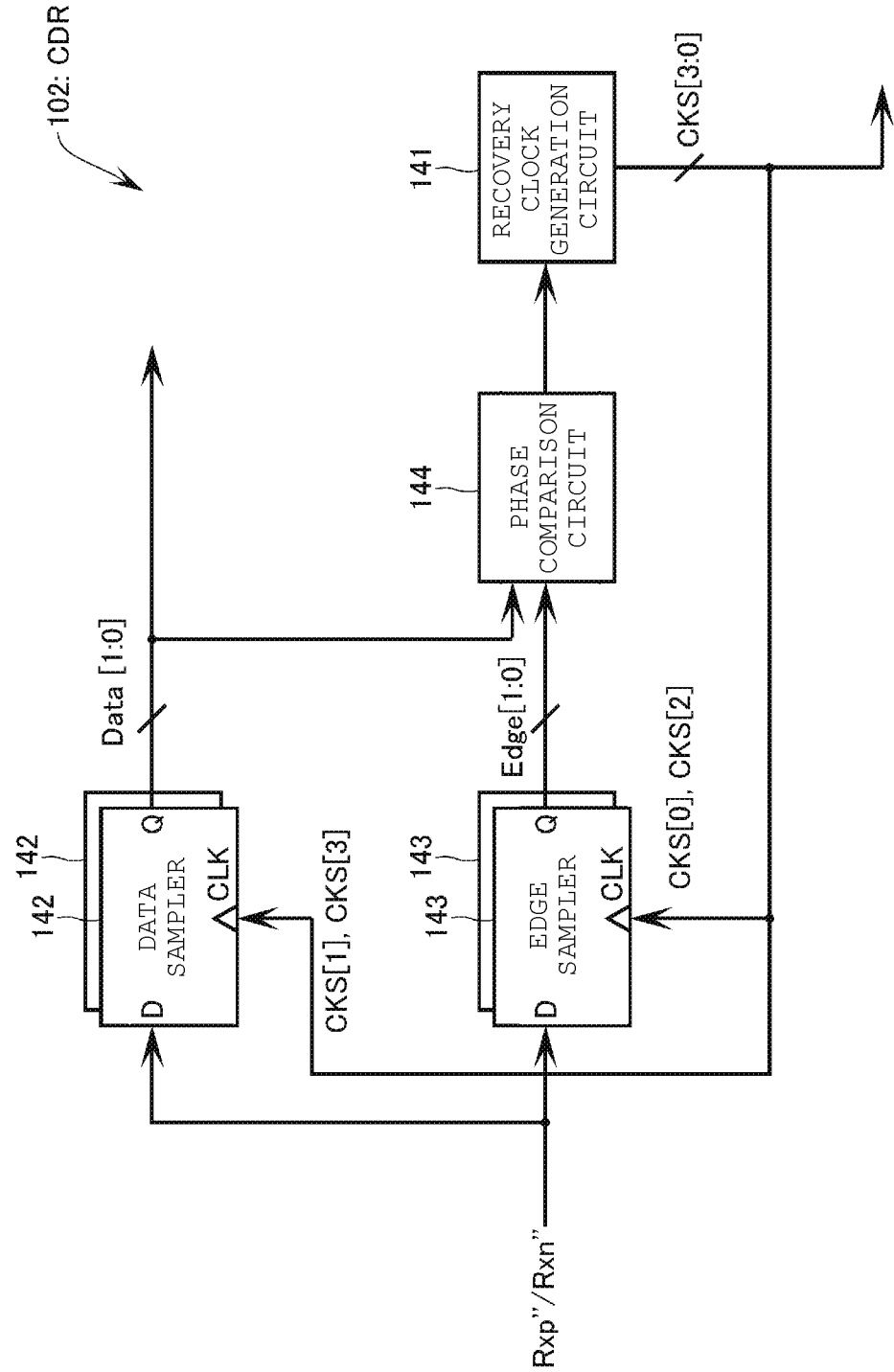
FIG. 5 is a schematic circuit diagram illustrating a configuration example of a clock data recovery (CDR) circuit in the controller die according to the embodiment.
Figure 6:
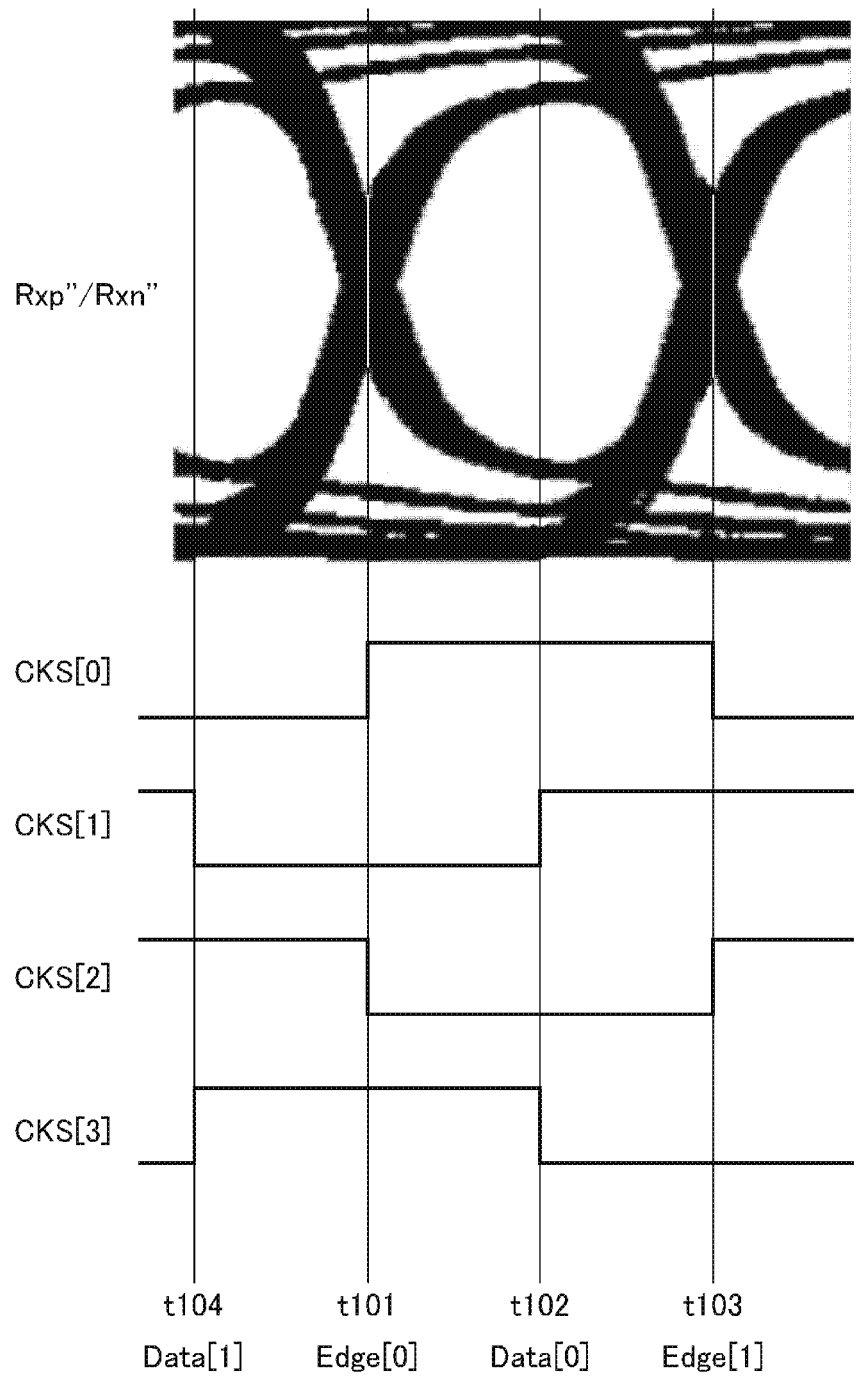
FIG. 6 is a schematic waveform diagram illustrating an operation of the CDR circuit in the controller die according to the embodiment.

FIG. 5 is a schematic circuit diagram illustrating a configuration example of the CDR circuit 102. FIG. 6 is a schematic waveform diagram illustrating an operation of the CDR circuit 102.

In the example of FIG. 5, input terminals of the CDR circuit 102 are electrically connected to the communication terminals Rxp"/Rxn". The communication terminals Rxp"/Rxn" may be, for example, the output terminals of the DFE in the equalizer circuit 101.

In the example of FIG. 5, the CDR circuit 102 includes a recovery clock generation circuit 141, two data samplers 142, two edge samplers 143, and a phase comparison circuit 144.

The recovery clock generation circuit 141 generates a signal CKS [3:0] having the same frequency as that of a data signal input from the host 20 (FIG. 1) through the communication terminals Rxp/Rxn, and outputs the generated signal CKS [3:0]. As illustrated in FIG. 6, a phase of a signal CKS [0] is earlier than a phase of a signal CKS [1] by ¼ wavelength. The phase of the signal CKS [1] is earlier than a phase of a signal CKS [2] by ¼ wavelength. The phase of the signal CKS [2] is earlier than a phase of a signal CKS [3] by ¼ wavelength. An output terminal of the recovery clock generation circuit 141 is connected to an input terminal of the SIPO circuit 103 (FIG. 2). The signal CKS [3:0] is output to the SIPO circuit 103 as a clock signal.

The data sampler 142 may be a D flip-flop, for example, as illustrated in FIG. 5. A D-terminal of the data sampler 142 is connected to the communication terminal Rxp"or Rxn". The signal CKS [1] or the signal CKS [3] is input to a clock terminal of the data sampler 142. A Q-terminal of the data sampler 142 outputs data Data [1:0]. As illustrated in FIG. 6, one of the data samplers 142 latches data Data [0] at a timing t102 at which the signal CKS [1] rises. The other one of the data samplers 142 latches data Data [1] at a timing t104 at which the signal CKS [3] rises. An output terminal of the data sampler 142 is connected to an input terminal of the SIPO circuit 103 (FIG. 2). The data [1:0] is output to the SIPO circuit 103 as a data signal.

The edge sampler 143 may be a D flip-flop, for example, as illustrated in FIG. 5. A D-terminal of the edge sampler 143 is connected to the communication terminal Rxp"or Rxn". The signal CKS [0] or the signal CKS [2] is input to a clock terminal of the edge sampler 143. A Q-terminal of the edge sampler 143 outputs an edge Edge [1:0]. As illustrated in FIG. 6, one of the edge samplers 143 latches an edge Edge [0] at a timing t101 at which the signal CKS [0] rises. The other one of the edge samplers 143 latches an edge Edge [1] at a timing t103 at which the signal CKS [2] rises.

The phase comparison circuit 144 examines the values of the data Data [1:0] and the values of the edge Edge [1:0] to determine whether or not the phase of the data signal (input from the host 20 (FIG. 1) through the communication terminals Rxp/Rxn) and the phase of the signal CKS [3:0] (output from the recovery clock generation circuit 141) are aligned, and adjusts the phase of the clock signal output from the recovery clock generation circuit 141 accordingly.

For example, when the values of Edge [0], Data [0], and Edge [1] are (0,0,1), the phase comparison circuit 144 determines that the phase of the signal CKS [3:0] is delayed, and outputs a signal for advancing the phase of the signal CKS [3:0] to the recovery clock generation circuit 141.

In addition, for example, when the values of Edge [0], Data [0], and Edge [1] are (0,1,1), the phase comparison circuit 144 determines that the phase of the signal CKS [3:0] is advanced, and outputs a signal for delaying the phase of the signal CKS [3:0] to the recovery clock generation circuit 141.

In addition, for example, when the values of Edge [0], Data [0], and Edge [1] are (1,0,0), the phase comparison circuit 144 determines that the phase of the signal CKS [3:0] is advanced, and outputs a signal for delaying the phase of the signal CKS [3:0] to the recovery clock generation circuit 141.

In addition, for example, when the values of Edge [0], Data [0], and Edge [1] are (1,1,0), the phase comparison circuit 144 determines that the phase of the signal CKS [3:0] is delayed, and outputs a signal for advancing the phase of the signal CKS [3:0] to the recovery clock generation circuit 141.

[Operation]

Figure 7:
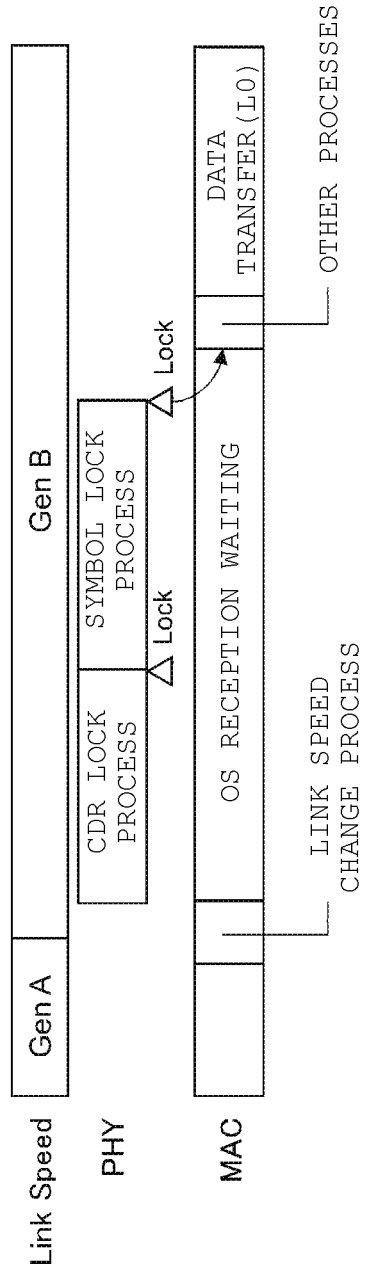
FIG. 7 is a schematic timing chart illustrating an operation of the memory system according to the embodiment.

Next, an operation of the memory system according to the embodiment will be described with reference to FIG. 7. FIG. 7 is a schematic timing chart illustrating the operation of the memory system according to the embodiment.

FIG. 7 illustrates a case where the link speed between the host 20 (FIG. 1) and the memory system 10 (FIG. 1) is switched from a link speed GenA to a link speed GenB. The link speed GenA (e.g., 16 Gbps) is a link speed determined based on, for example, the fourth generation standards of PCIe. The link speed GenB (e.g., 5.0 Gbps) is a link speed determined based on, for example, the second generation standards of PCIe.

The medium access control circuit 120 (FIG. 2) executes a link speed change process when the link speed is switched. When the link speed change process ends, the medium access control circuit 120 starts an OS reception waiting process.

In addition, when the link speed change process ends, the physical layer control circuit 100 (FIG. 2) starts a CDR lock process. In the CDR lock process, the CDR circuit 102 described above with reference to FIG. 5 adjusts a phase difference between the data signal (input from the host 20 (FIG. 1) through the reception terminals Rxp/Rxn) and the signal CKS [3:0].

The CDR lock process is executed for a predetermined period of time. When the CDR lock process ends, the physical layer control circuit 100 (FIG. 2) starts a symbol lock process. In the symbol lock process, a symbol start position in the 10-bit parallel signal output from the SIPO circuit 103 is detected by the aligner circuit 104 described above with reference to FIG. 2.

When the symbol lock process ends, the medium access control circuit 120 (FIG. 2) receives an OS. When a predetermined OS is detected, the OS reception waiting process ends.

When the OS reception waiting process ends, the medium access control circuit 120 executes other processes required for communication with the host 20 (FIG. 1). Next, the medium access control circuit 120 enters an active state (e.g., L0 state), and communicates with the host 20 (FIG. 1).

[CDR Erroneous Lock]

Figure 8:
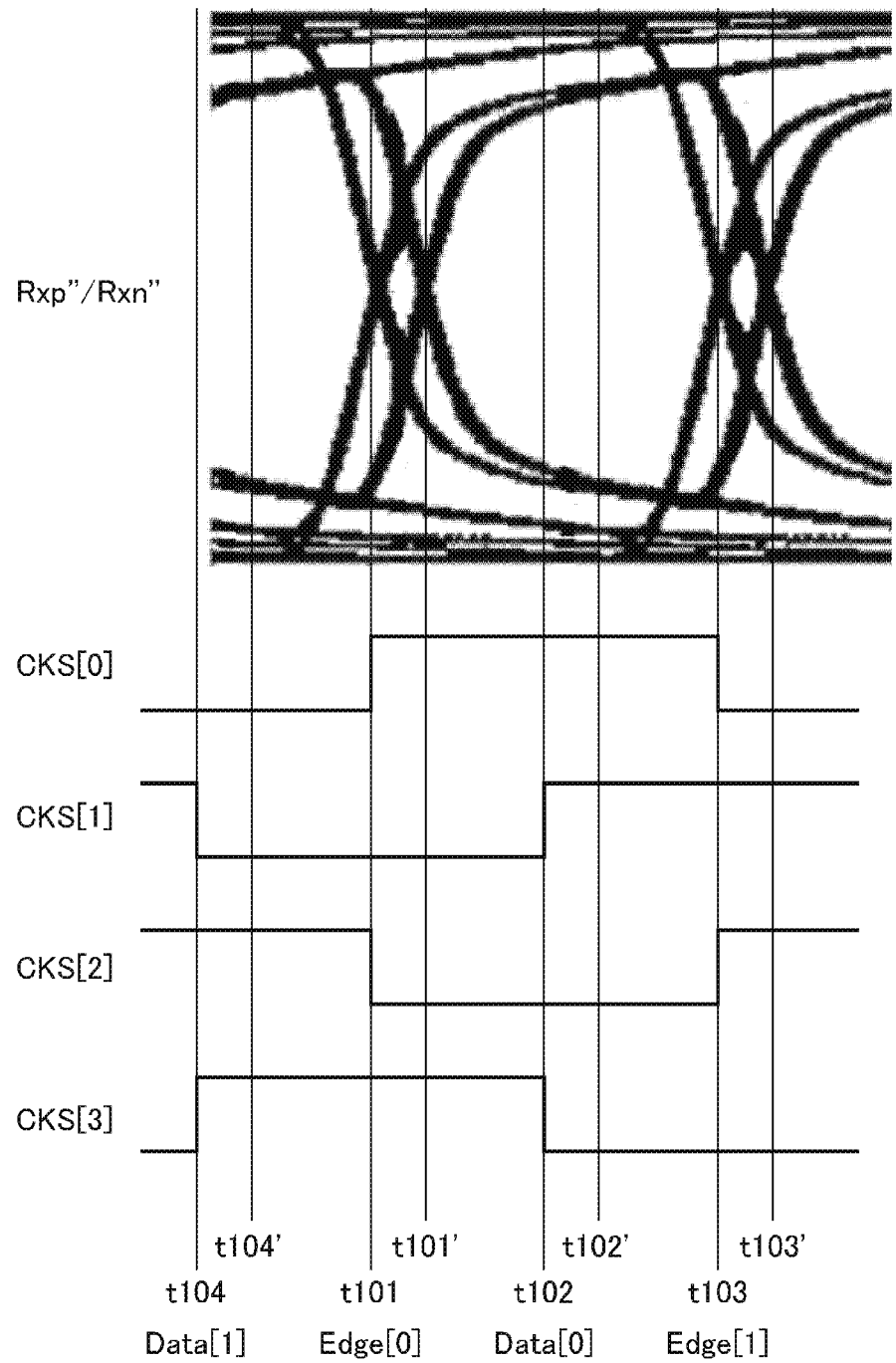
FIG. 8 is a schematic waveform diagram illustrating a CDR erroneous lock phenomenon.

Next, a CDR erroneous lock will be described with reference to FIG. 8. FIG. 8 is a schematic waveform diagram illustrating the CDR erroneous lock.

As described above with reference to FIG. 2 or the like, the equalizer circuit 101 includes the CTLE. Here, when the control parameter for the CTLE is inappropriate, for example, as illustrated in FIG. 8, timings at which data is inverted in the output signal of the equalizer circuit 101 (i.e., the signal of the communication terminals Rxp"/Rxn") may be split into two timings. For example, in the example of FIG. 8, the data inversion occurs at a timing t101 and a timing t101'. In addition, in the example of FIG. 8, the data inversion occurs at a timing t103 and a timing t103'. Hereinafter, this phenomenon will be referred to as "edge splitting".

When the edge splitting occurs, the phase of the signal CKS [3:0] may be adjusted based on the timings t101 and t103. For example, as described above with reference to FIGS. 5 and 6, the timing t102, at which the data Data [0] is latched, is adjusted to be later than the timing t101, at which the edge Edge [0] is latched, by ¼ wavelength and to be earlier than the timing t103, at which the edge Edge [1] is latched, by ¼ wavelength. In addition, the timing t104, at which the data Data [1] is latched, is adjusted to be later than the timing t103, at which the edge Edge [1] is latched, by ¼ wavelength and to be earlier than the timing t101, at which the edge Edge [0] is latched, by ¼ wavelength.

In this case, for example, the data of the signal that is inverted at the timing t101 and the data of the signal that is inverted at the timing t103 are properly acquired. However, it is desired that the data of the signal that is inverted at the timing t101' and the data of the signal that is inverted at the timing t103' are acquired at timings t102' and t104' adjusted based on the timings t101' and t103'. The timing t102' is later than the timing t101' by ¼ wavelength and is earlier than the timing t103' by ¼ wavelength. In addition, the timing t104' is later than the timing t103' by ¼ wavelength and is earlier than the timing t101' by ¼ wavelength.

For example, when there is a large difference between the timing t101 and the timing t101' and when there is a large difference between the timing t103 and the timing t103', data may be sampled at a timing at which the signals inverted at the timings t101' and t103' cannot be distinguished between "high (H)" and "low (L)". As a result, there may be a case where the data of the signals inverted at the timings t101' and t103' cannot be properly detected. Hereinafter, this phenomenon will be referred to as the "CDR erroneous lock".

Here, for example, when the CDR erroneous lock occurs in the CDR lock process described above with reference to FIG. 7, there may be a case where the symbol start position in the 10-bit parallel signal output from the SIPO circuit 103 (FIG. 2) cannot be properly detected in the symbol lock process and the symbol lock process cannot end. In addition, even if the symbol lock process ends, there may be a case where a predetermined OS cannot be detected in the CDR lock detector 122. In such a case, the OS reception waiting process does not end. Here, when a predetermined period of time has elapsed in a state where the OS reception waiting process does not end, a communication error may occur.

[Process when CDR Erroneous Lock Occurs in Memory System According to Embodiment]

Figure 9:
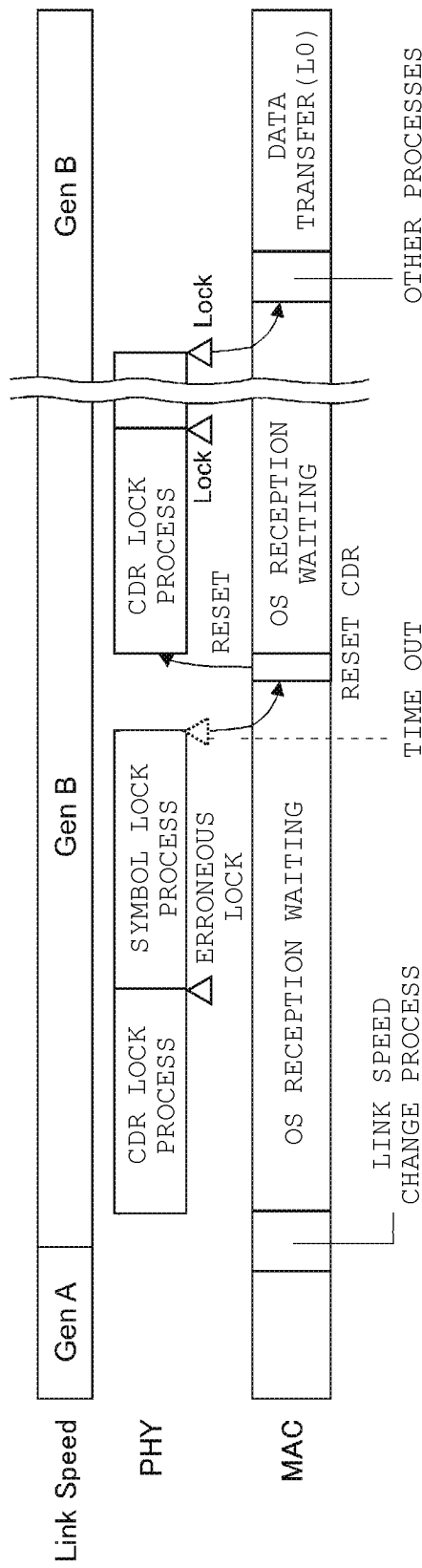
FIG. 9 is a schematic timing chart illustrating an operation of the memory system according to the embodiment.

Next, a process when the CDR erroneous lock occurs in the memory system according to the embodiment will be described with reference to FIG. 9. FIG. 9 is a schematic timing chart illustrating an operation of the memory system according to the embodiment.

The process illustrated in FIG. 9 is substantially the same as the process illustrated in FIG. 7. In the example of FIG. 7, the CDR erroneous lock does not occur in the CDR lock process. On the other hand, in the example of FIG. 9, it is assumed that the CDR erroneous lock occurs in the CDR lock process.

In the example of FIG. 9, as in the example of FIG. 7, when the CDR lock process ends, the physical layer control circuit 100 (FIG. 2) starts the symbol lock process. In the example of FIG. 9, the CDR erroneous lock occurs in the CDR lock process. As a result, the symbol start position in the 10-bit parallel signal output from the SIPO circuit 103 (FIG. 2) cannot be properly detected in the symbol lock process, and a predetermined period of time elapses.

When the predetermined period of time has elapsed in a state where the OS reception waiting process does not end, the medium access control circuit 120 resets the state of the CDR circuit 102. The predetermined period of time is, for example, an elapsed time from the start of the CDR lock process. When the state of the CDR circuit 102 is reset, for example, one or more new RxEQ values are output from the RxEQ value controller 123 described above with reference to FIG. 2 or the like. Accordingly, the control parameters of CTLE or DFE of the equalizer circuit 101 are changed.

In addition, a change of the RxEQ values is detected by the Rx change detector 106, and the state of the CDR circuit 102 is reset. More specifically, the state of at least one of the recovery clock generation circuit 141, the data sampler 142, the edge sampler 143, and the phase comparison circuit 144 is reset.

When the state of the CDR circuit 102 is reset, the medium access control circuit 120 re-starts the OS reception waiting process again. In addition, when the state of the CDR circuit 102 is reset, the physical layer control circuit 100 (FIG. 2) re-starts the CDR lock process. Subsequent processes are executed as in the processes described above with reference to FIG. 7.

[Process when CDR Erroneous Lock Occurs in Memory System According to Comparative Example]

Next, a process when the CDR erroneous lock occurs in a memory system according to a comparative example will be described with reference to FIG. 10. FIG. 10 is a schematic timing chart illustrating an operation of the memory system according to the comparative example.

In the memory system according to the comparative example, when a predetermined period of time has elapsed in a state where the OS reception waiting process does not end, a communication error occurs. In the memory system according to the comparative example, the link speed is switched from the link speed GenB back to the link speed GenA. For example, in the example of FIG. 10, when a predetermined period of time has elapsed in a state where the OS reception waiting process does not end, the link speed change process and the OS reception waiting process are executed.

[Effect of Memory System According to Embodiment]

When the CDR erroneous lock occurs in the memory system according to the comparative example, as illustrated in FIG. 10, first, it is necessary to execute a process (for example, the link speed change process or the OS reception waiting process) for switching the link speed from the link speed GenB back to the link speed GenA. Next, when data communication at the link speed GenB is attempted again, it is necessary to execute a process (for example, the link speed change process, the CDR lock process, or the symbol lock process) for switching the link speed from the link speed GenA to the link speed GenB. Further, in the CDR lock process, the CDR erroneous lock may occur again.

On the other hand, in the memory system according to the embodiment, the CDR lock process can be executed again without executing the link speed change process or the like. In addition, by changing the control parameter of the CTLE or DFE of the equalizer circuit 101, the occurrence of the CDR erroneous lock can be prevented.

[Execution Method of Operation Described with Reference to FIG. 9]

As described above, in the memory system according to the embodiment, when the state of the CDR circuit 102 is reset, the RxEQ value controller 123 (FIG. 2) outputs the RxEQ values and changes the control parameters of CTLE or DFE.

Here, the RxEQ value controller 123 may include a plurality of registers that store a plurality of RxEQ values. In addition, when the state of the CDR circuit 102 is reset, one of the plurality of RxEQ values stored in the plurality of registers may be output.

In addition, the RxEQ value controller 123 may calculate one or more RxEQ values appropriate for the link speed GenB based on the RxEQ values adopted for the link speed GenA, and may output the calculated RxEQ values.

In addition, the operation described above with reference to FIG. 9 may be executed whenever the link speed is switched to the link speed GenB, and may be executed only at a specific timing. For example, the operation described above with reference to FIG. 9 may be executed only at a timing at which the link speed is switched to the link speed GenB first after the start of the communication with the host 20 (FIG. 1). In this case, appropriate RxEQ values can be acquired in this operation. Accordingly, when the link speed is switched to the link speed GenB at a subsequent timing, the equalizer circuit 101 may be controlled using these RxEQ values.

In addition, in the example of FIG. 9, the state of the CDR circuit 102 may be reset only once, and may change the RxEQ values only once. However, the reset of the state of the CDR circuit 102 and the change of the RxEQ values may be executed two or more times.

Other Embodiments

Hereinabove, the memory system according to the embodiment is described. However, the memory system according to the embodiment is merely an example, and the specific configuration, operation, and the like may be appropriately adjusted.

For example, the configurations illustrated in FIGS. 2 to 5 may be appropriately changed. For example, in the example of FIG. 2, the Rx change detector 106 is provided in the physical layer control circuit 100. However, the Rx change detector 106 may be provided in the medium access control circuit 120.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a nonvolatile memory; and
a controller electrically connected to the nonvolatile memory and including at least an equalizer circuit and a clock-and-data output circuit,
wherein the equalizer circuit is configured to:
receive a first data signal from a host via a serial communication;
reduce an inter-symbol interference jitter of the first data signal to generate a second data signal; and
output the second data signal, and
the clock-and-data output circuit is configured to:
extract a third data signal and a clock signal from the second data signal; and
output the third data signal and the clock signal, and
wherein the controller is configured to:
execute, when a link speed with the host is switched from a first link speed to a second link speed, a detection process of detecting predetermined data in the third data signal based on the first data signal received from the host at the second link speed; and
reset a state of the clock-and-data output circuit when the predetermined data is not detected within a predetermined period of time in the detection process.

2. The memory system according to claim 1,
wherein the controller is configured to:
change a control parameter for the equalizer circuit when the predetermined data is not detected within the predetermined period of time in the detection process.

3. The memory system according to claim 2,
wherein the equalizer circuit includes a variable resistance, a variable capacitor, and a constant current source, and
the control parameter includes at least one of a resistance value of the variable resistance, a capacitance value of the variable capacitor, and a current value or a drive voltage of the constant current source.

4. The memory system according to claim 2,
wherein the controller is configured to determine the changed control parameter based on the control parameter for the equalizer circuit used with the first link speed.

5. The memory system according to claim 1,
wherein the controller further includes a physical layer control circuit and a medium access control circuit, the physical layer control circuit including the equalizer circuit and the clock-and-data output circuit, and the medium access control circuit including a lock detector, and
the state of the clock-and-data output circuit is reset if a lock detection signal is not output from the lock detector within the predetermined period of time.

6. The memory system according to claim 5,
wherein the medium access control circuit further includes a parameter controller configured to output a control parameter for the equalizer circuit if the lock detection signal is not output from the lock detector within the predetermined period of time, at least one of the physical layer control circuit and the medium access control circuit further includes a parameter change detection circuit configured to detect a change in the control parameter, and the parameter change detection circuit is configured to output a reset signal to the clock-and-data output circuit when the control parameter is changed.

7. The memory system according to claim 6, wherein the physical layer control circuit includes the parameter change detection circuit.

8. The memory system according to claim 6, wherein the medium access control circuit includes the parameter change detection circuit.

9. The memory system according to claim 1, wherein the first link speed is faster than the second link speed.

10. The memory system according to claim 1, wherein the first link speed is slower than the second link speed.

11. A method of executing a link speed change in a memory system, the memory system including a nonvolatile memory, and a controller electrically connected to the nonvolatile memory and including at least an equalizer circuit and a clock-and-data output circuit, said method comprising:

reducing, by the equalizer circuit, an inter-symbol interference jitter of a first data signal received from a host via a serial communication;

outputting the first data signal with the reduced inter-symbol interference jitter from the equalizer circuit as a second data signal;

extracting, by the clock-and-data output circuit, a third data signal and a clock signal from the second data signal;

outputting the third data signal and the clock signal;

executing a process to detect predetermined data in the third data signal based on the first data signal; and resetting a state of the clock-and-data output circuit when the predetermined data is not detected within a predetermined period of time.

12. The method according to claim 11, further comprising:

changing a control parameter for the equalizer circuit when the predetermined data is not detected within the predetermined period of time.

13. The method according to claim 12, wherein the equalizer circuit includes a variable resistance, a variable capacitor, and a constant current source, and the control parameter includes at least one of a resistance value of the variable resistance, a capacitance value of the variable capacitor, and a current value or a drive voltage of the constant current source.

14. The method according to claim 12, further comprising:

determining the changed control parameter based on the control parameter for the equalizer circuit used with a previous link speed.

15. The method according to claim 11, wherein the controller further includes a physical layer control circuit and a medium access control circuit, the physical layer control circuit including the equalizer circuit and the clock-and-data output circuit, and the medium access control circuit including a lock detector, and the state of the clock-and-data output circuit is reset if a lock detection signal is not output from the lock detector within the predetermined period of time.

16. The method according to claim 15, further comprising:

outputting a control parameter for the equalizer circuit if the lock detection signal is not output from the lock detector within the predetermined period of time.

17. The method according to claim 16, further comprising:

detecting a change in the control parameter; and outputting a reset signal to the clock-and-data output circuit when the control parameter is changed.

18. The method according to claim 16, wherein one of the physical layer control circuit and the medium access control circuit includes a parameter change detection circuit.

19. The method according to claim 11, wherein the process is executed when a link speed with the host is switched from a first link speed to a second link speed that is slower than the first link speed.

20. The method according to claim 11, wherein the process is executed when a link speed with the host is switched from a first link speed to a second link speed that is faster than the first link speed.

* * * * *